United States Patent
Potocek

(10) Patent No.: US 10,928,335 B2
(45) Date of Patent: Feb. 23, 2021

(54) ADAPTIVE SPECIMEN IMAGE ACQUISITION USING AN ARTIFICIAL NEURAL NETWORK

(71) Applicant: FEI Company, Hillsboro, OR (US)

(72) Inventor: Pavel Potocek, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/516,837

(22) Filed: Jul. 19, 2019

(65) Prior Publication Data
US 2020/0025696 A1    Jan. 23, 2020

(30) Foreign Application Priority Data
Jul. 19, 2018    (EP) .................................... 18184339

(51) Int. Cl.
*G01N 23/2251*    (2018.01)
*H01J 37/26*    (2006.01)
*H01J 37/28*    (2006.01)

(52) U.S. Cl.
CPC ........ *G01N 23/2251* (2013.01); *H01J 37/265* (2013.01); *H01J 37/28* (2013.01);
(Continued)

(58) Field of Classification Search
CPC ........ G01N 23/2251; G01N 2223/401; G01N 2223/408; G01N 2223/418; H01J 37/222; H01J 37/265; H01J 37/28; H01J 2237/2803; H01J 2237/2809; G06T 2207/10061; G06T 2207/20084; G06T 7/11
(Continued)

(56) References Cited

U.S. PATENT DOCUMENTS

| 2016/0292876 A1 | 10/2016 | Zhao et al. |
| 2017/0169992 A1 | 6/2017 | Kobayashi et al. |

(Continued)

FOREIGN PATENT DOCUMENTS

| EP | 2665083 | 11/2013 |
| WO | 2010135075 | 11/2010 |
| WO | 2016013930 | 1/2016 |

OTHER PUBLICATIONS

Trujillo, Maria Celeste et al., Segmentation of carbon nanotube images through an artificial neural network, Soft Computing, Springer Verlag, vol. 21, No. 3, Nov. 9, 2016, pp. 611-625, Berlin, Germany.

*Primary Examiner* — Kiet T Nguyen

(57) ABSTRACT

Techniques for adapting an adaptive specimen image acquisition system using an artificial neural network (ANN) are disclosed. An adaptive specimen image acquisition system is configurable to scan a specimen to produce images of varying qualities. An adaptive specimen image acquisition system first scans a specimen to produce a low-quality image. An ANN identifies objects of interest within the specimen image. A scan mask indicates regions of the image corresponding to the objects of interest. The adaptive specimen image acquisition system scans only the regions of the image corresponding to the objects of interest, as indicated by the scan mask, to produce a high-quality image. The low-quality image and the high-quality image are merged in a final image. The final image shows the objects of interest at a higher quality, and the rest of the specimen at a lower quality.

20 Claims, 12 Drawing Sheets

(52) U.S. Cl.
CPC .............. *G01N 2223/401* (2013.01); *G01N 2223/408* (2013.01); *G01N 2223/418* (2013.01)

(58) Field of Classification Search
USPC ........................................ 250/310, 306, 307
See application file for complete search history.

(56) References Cited

U.S. PATENT DOCUMENTS

2018/0075594 A1* 3/2018 Brauer ............... G01N 21/9501
2018/0107928 A1    4/2018 Zhang et al.
2019/0354019 A1* 11/2019 Freytag .................. G03F 7/705

* cited by examiner

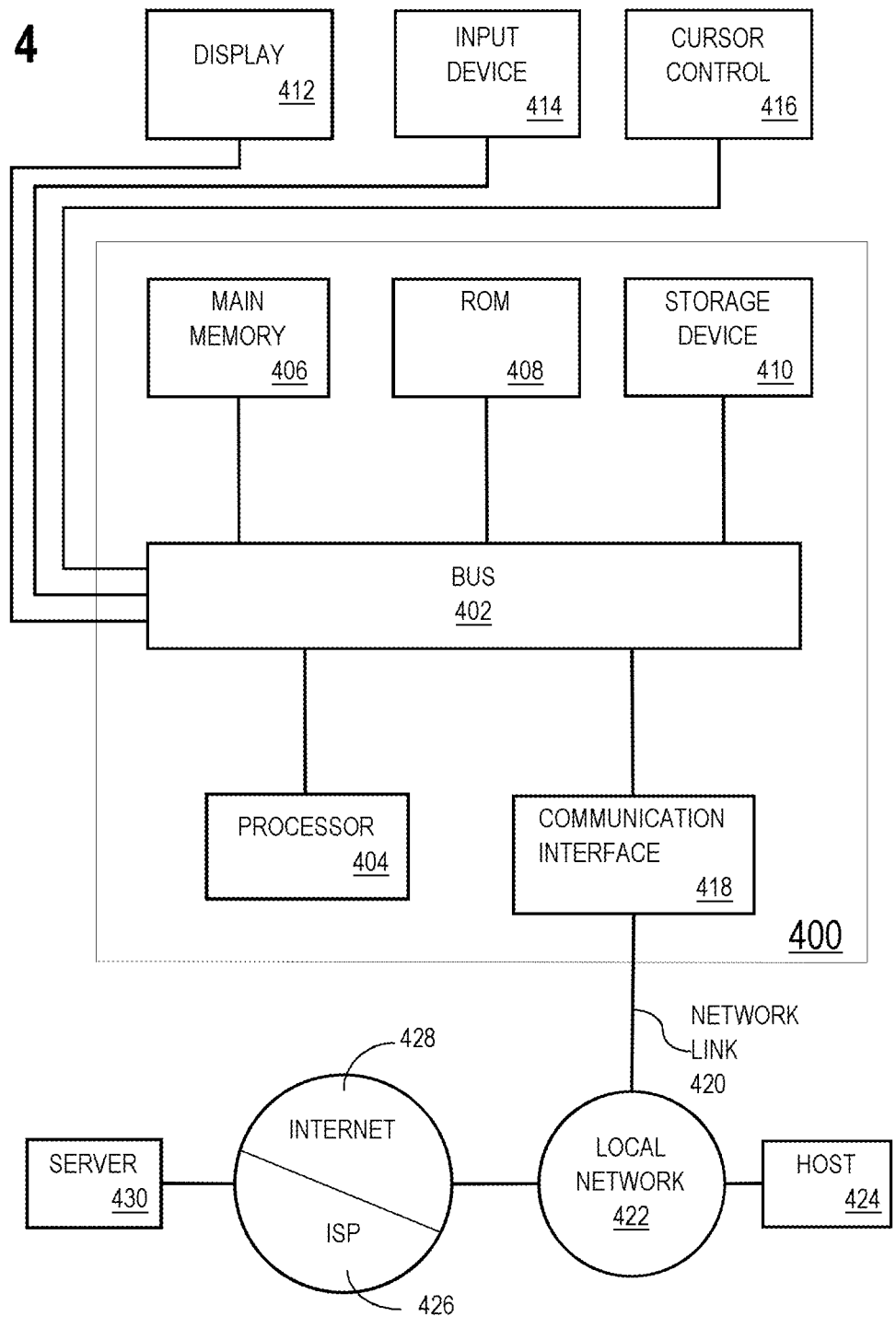

ADAPTIVE SPECIMEN IMAGE ACQUISITION USING AN ARTIFICIAL NEURAL NETWORK

TECHNICAL FIELD

The present disclosure relates to specimen image acquisition. In particular, the present disclosure relates to adaptive specimen image acquisition using an artificial neural network.

BACKGROUND

Microscopy is the technical field of using microscopes to better view objects that are difficult to see with the naked eye. Different branches of microscopy include, for example: optical microscopy, charged particle (electron and/or ion) microscopy, and scanning probe microscopy.

Charged particle microscopy involves using a beam of accelerated charged particles as a source of illumination. Types of electron microscopy include, for example: transmission electron microscopy, scanning electron microscopy, scanning transmission electron microscopy, and focused ion beam microscopy.

Components of a transmission electron microscope (TEM) include: an electron optical column, a vacuum system, the necessary electronics (lens supplies for focusing and deflecting the beam and the high voltage generator for the electron source), and control software. An electron optical column includes an electron gun on one end and a viewing device (such as a camera) on the other end. An electron beam emerges from the electron gun, and passes through a thin specimen, transmitting electrons which are collected, focused, and projected onto the viewing device. The entire electron path from gun to camera is under vacuum.

Similar to a TEM, components of a scanning electron microscope (SEM) include: an electron optical column, a vacuum system, the necessary electronics (lens supplies for focusing and deflecting the beam and the high voltage generator for the electron source), and control software. An electron gun is positioned on one end of the electron optical column. A specimen is positioned on the other end of the electron column. An electron beam from the electron gun is focused into a fine spot on the specimen surface. The electron beam is scanned in a rectangular raster over the specimen. The intensities of various signals created by interactions between the beam electrons and the specimen are measured and stored in computer memory. The stored values are then mapped as variations in brightness on the image display.

A scanning transmission electron microscope (STEM) is similar to a TEM in images are formed by electrons passing through a sufficiently thin specimen. However, unlike TEM, a STEM focuses the electron beam on a fine spot, which is then scanned over the sample in a raster illumination system.

A focused ion beam microscope (FIB microscope) is similar to a SEM, however a FIB microscope uses a beam of ions instead of a beam of electrons. Examples of ion beam sources include liquid metal ion sources (LMIS), such as gallium ion sources.

A microscope is associated with a variety of configurable microscopy parameters. Examples of microscopy parameters of a SEM include: an accelerating voltage (a voltage at which electrons are being accelerated as the electrons travel through an electron optical column); a convergence angle of the electron beam; a beam current; a spot size (a diameter of the beam spot on the specimen); a dwell time; and a resolution. Different values for the various microscopy parameters result in images of different qualities and attributes. For example, higher magnification requires a smaller spot size. Higher signal-to-noise ratio and contrast resolution requires greater beam current. However, reducing the spot size also decreases the beam current.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

One of the drawbacks associated with acquisition of specimen images, is that it takes a lot of time and effort to produce a high quality image of a region of interest of a specimen. This is because scanning a specimen using a relatively high-quality setting, to obtain a relatively high-quality specimen image, generally takes a large amount of time and resources.

It is an object of the invention to improve specimen image acquisition. In particular, it is an object to provide an improved method of acquiring a specimen image with which a high quality image can be obtained in a more effective way.

SUMMARY

To this end, the invention provides a method as defined in claim 1. The method according to the invention includes the step of obtaining a first image of a specimen that is produced by scanning the specimen using a first set of one or more values for a set of one or more microscopy parameters. An artificial neural network is used to identify one or more objects of interest within the first image. Based on that, a scan mask indicating a first set of one or more regions corresponding to the objects of interest identified is generated using the artificial neural network. Based on the scan mask, instructions are provided to scan the first set of regions of the specimen using a second set of values for the set of microscopy parameters to obtain a second image of the specimen. The method may in an embodiment be performed by at least one device including a hardware processor. With the method according to the invention, it is possible to scan the specimen a first time at relatively low quality settings, identify regions of interest (e.g. using the neural network) in the image obtained, and to indicate (using a scan mask) what regions of the specimen need to be scanned a second time, for example at a relatively high quality setting. This means that only a part of the specimen needs to be scanned at the relatively high quality setting, saving valuable time and energy. The low-quality image and the high-quality image may then be merged in a final image. The final image shows the objects of interest at a higher quality, and the rest of the specimen at a lower quality. By focusing high-quality scanning on only the objects of interest, time, energy, and/or other resources for producing a high-quality image of the specimen are reduced. Moreover, since the final image shows the objects of interest in relatively high quality, despite the fact that the remaining areas are shown in relatively low quality, the final image is sufficient to allow analysis of the objects of interest. With this, the object of the invention is achieved.

In an embodiment, the scan mask further indicates a second set of one or more regions not corresponding to the objects of interest identified using the artificial neural network. The method may further comprise the steps of: based on the scan mask, refraining from providing any instructions to scan the second set of regions of the specimen using the second set of values for the set of microscopy parameters. This way, an image of the objects of interest using the second set of values for the set of microscopy parameters can be obtained, without scanning the entire specimen using the second set of values for the set of microscopy parameters.

In an embodiment, the first set of regions in the scan mask includes: (a) areas of the objects of interest within the first image, and (b) regions adjacent to the areas of the objects of interest within the first image. This way, not only (a) the objects of interest are scanned using the second set of values for the microscopy parameters, but (b) adjacent areas that may give context to the objects of interest, and/or (c) adjacent areas which may have been erroneously identified by the ANN as not including any objects of interest may be scanned as well. This ensures that at least some context is given to the objects of interests, and/or that the probability that mistakes made by the ANN are visible in a final image is reduced.

In an embodiment, the method comprises: overwriting a portion of the first image with data from the second image to obtain a combined image. This way a final image is obtained including both (a) objects of interest scanned using the second set of values for the microscopy parameters (e.g. higher quality settings) and (b) other regions of the specimen using the first set of values for the microscopy parameters (e.g. lower quality settings). The final image is obtained in a time efficient way, but does include specific and desired information on the regions of interest. The specific and desired information may for example be a higher resolution. An additional advantage is that the final image may actually comprise less data compared to a full resolution high quality image. Thus, the final image obtained with this embodiment provides a storage advantage as well.

In an embodiment, overwriting the portion of the first image with data from the second image comprises: determining that a particular position in the first image is within the first set of regions of the scan mask; determining a data value for the particular position in the second image; copying the data value from the particular position in the second image to the particular position in the first image.

In an embodiment, overwriting the portion of the first image with data from the second image comprises: determining that a particular position in the first image is within the first set of regions of the scan mask, wherein the scan mask is generated from a prediction mask output from the artificial neural network; determining a prediction value for the particular position based on the prediction mask; determining a weight to be applied to a data value for the particular position in the second image based on the prediction value for the particular position based on the prediction mask; applying the weight to the data value for the particular position in the second image to obtained a weighted data value; overwriting the particular position in the first image with the weighted data value.

In an embodiment, the method comprises the steps of: generating a prediction mask, based on the artificial neural network, that indicates one or more areas of the objects of interest; and generating the scan mask based on the prediction mask. The ANN is used to generate a prediction mask, which is used to generate a scan mask. ANNs have the ability to learn and model non-linear and complex relationships. There are a vast amount of specimens that can be studied in microscopy, such as a charged particle microscope. In the field of life sciences, examples of specimens include tissues, cells, protein structures, and viruses. In the field of natural resources, examples of specimens include oil, gas, organic materials, and rocks. In the field of semiconductors, examples of specimens include crystalline materials, and semiconductor materials. Specimens in additional and/or alternative fields may be used. All these specimens in these different fields have their own particular regions of interests, which may vary from user to user as well. An ANN is very much suitable to be used in these different fields. Additionally, ANNs can generalize, meaning that they can infer unseen relationships on unseen data as well. For example, this allows regions of interests to be identified, even if the ANN was not trained with that specific region of interest. A further advantage of an ANN is that it does not impose any restrictions on the input variables (like how they should be distributed).

In an embodiment, generating the scan mask based on the prediction mask comprises: comparing a prediction value for a particular position in the prediction mask with a threshold value; responsive to determining that the prediction value for the particular position in the prediction mask is above the threshold value: determining that the particular position is within the first set of regions, in the scan mask, corresponding to the objects of interest identified using the artificial neural network; responsive to determining that the prediction value for the particular position in the prediction mask is below the threshold value: determining that the particular position is within a second set of regions, in the scan mask, not corresponding to the objects of interest identified using the artificial neural network.

In an embodiment, the method comprises the step of scanning the specimen using the first set of values for the set of microscopy parameters. The method may also include the step of scanning the specimen using the second set of values for the set of microscopy parameters. The instructions may be provided to an electron microscope.

It is noted that the set of microscopy parameters may comprise one or more of: a dwell time; a resolution; an accelerating voltage; a beam current; a convergence angle; and a spot size.

According to an aspect of the invention, a non-transitory computer readable medium is provided according to claim 13. The non-transitory computer readable medium comprises instructions which, when executed by one or more hardware processors, cause performance of operations as recited in any of the embodiments above. Advantages have been discussed already above.

According to a further aspect of the invention, a system is provided according to claim 14. The system comprises at least one device including a hardware processor. The system is configured to perform operations as recited with respect to the method according to the invention as described above. The system may, in embodiments, comprise one or more means for performing operations as recited in the description above.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings:

FIG. 4 shows a block diagram that illustrates a computer system in accordance with one or more embodiments.

DETAILED DESCRIPTION

Figure 1A:
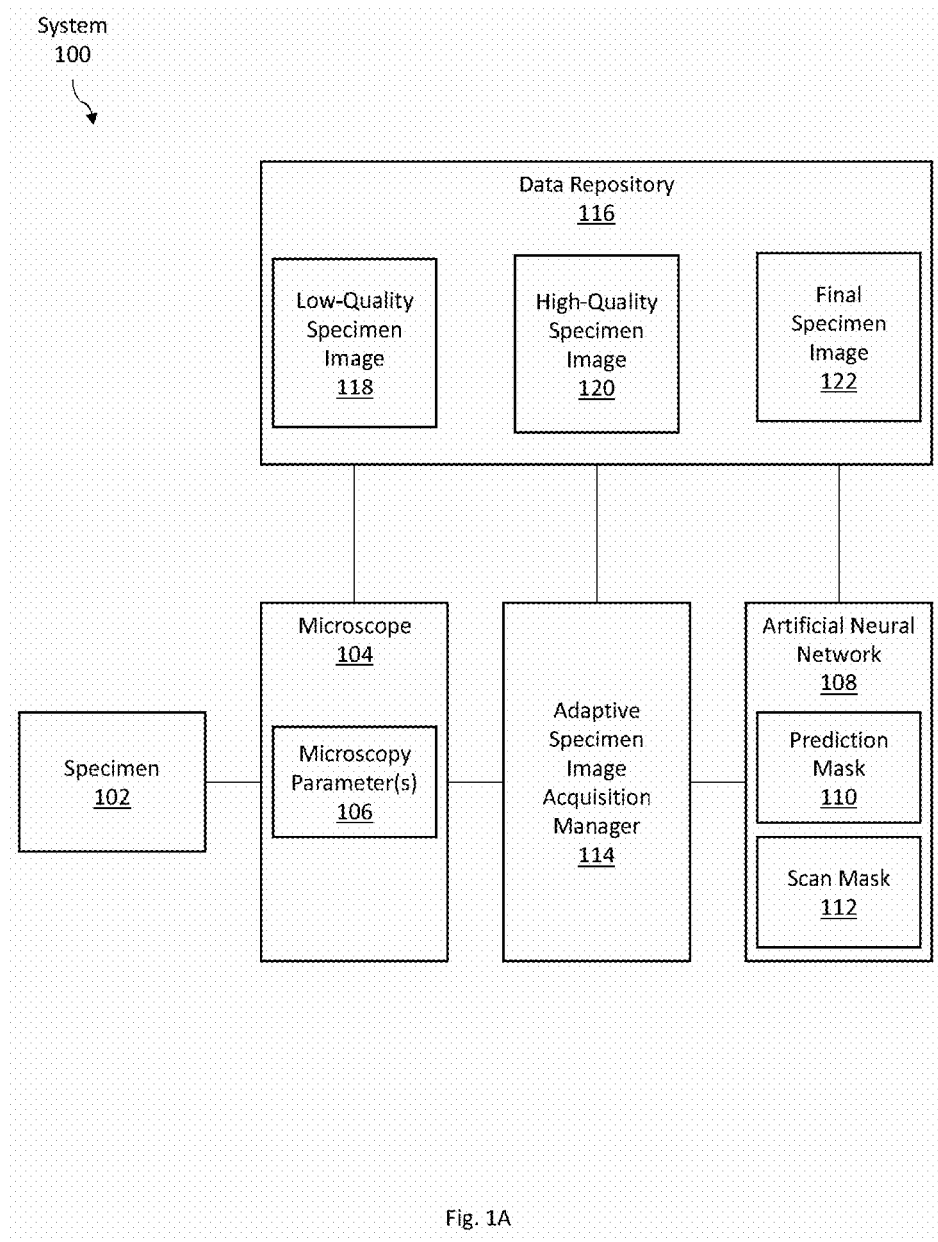
FIG. 1A illustrates an example adaptive specimen image acquisition system, in accordance with one or more embodiments.

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW
2. ADAPTIVE SPECIMEN IMAGE ACQUISITION SYSTEM ARCHITECTURE
3. ADAPTING AN ADAPTIVE SPECIMEN IMAGE ACQUISITION SYSTEM USING AN ARTIFICIAL NEURAL NETWORK
4. EXAMPLE EMBODIMENT
5. ARTIFICIAL NEURAL NETWORKS
6. HARDWARE OVERVIEW
7. MISCELLANEOUS; EXTENSIONS

1. General Overview

A microscope is configurable to scan a specimen to produce images of varying qualities. One method for obtaining a relatively high-quality image is to set relatively high-quality microscopy parameters for the microscope, and to scan a specimen using the relatively high-quality microscopy parameters. For an SEM, for example, relatively high-quality microscopy parameters may include a relatively-high beam current and a relatively-high dwell time. However, a drawback of the above method is that using relatively high-quality microscopy parameters to scan a specimen may utilize more time, energy, and/or other resources than using relatively low-quality microscopy parameters. Additionally, some sample types, such as biological samples, may be undesirably damaged by the high-quality microscopy parameters. The methods disclosed herein address the above problem(s) by using relatively high-quality microscopy parameters for objects of interest within the specimen, and using relatively low-quality microscopy parameters for the remainder of the specimen.

One or more embodiments include adapting an adaptive specimen image acquisition system using an artificial neural network. An adaptive specimen image acquisition system first scans a specimen to produce a low-quality image. An artificial neural network identifies objects of interest within the specimen image. A scan mask indicates regions of the image corresponding to the objects of interest. The adaptive specimen image acquisition system scans only the regions of the image corresponding to the objects of interest, as indicated by the scan mask, to produce a high-quality image. The low-quality image and the high-quality image are merged in a final image. The final image shows the objects of interest at a higher quality, and the rest of the specimen at a lower quality. By focusing high-quality scanning on only the objects of interest, time, energy, and/or other resources for producing a high-quality image of the specimen are reduced. Moreover, since the final image shows the objects of interest in relatively high quality, despite the fact that the remaining areas are shown in relatively low quality, the final image is sufficient to allow analysis of the objects of interest.

One or more embodiments described in this Specification and/or recited in the claims may not be included in this General Overview section.

2. Adaptive Specimen Image Acquisition System Architecture

FIG. 1A illustrates an example adaptive specimen image acquisition system, in accordance with one or more embodiments. As illustrated in FIG. 1A, a system 100 includes a specimen 102, a microscope 104, an artificial neural network (ANN) 108, a merging module 114, and a data repository 116. In one or more embodiments, the system 100 may include more or fewer components than the components illustrated in FIG. 1A. The components illustrated in FIG. 1A may be local to or remote from each other. The components illustrated in FIG. 1A may be implemented in software and/or hardware. Each component may be distributed over multiple applications and/or machines. Multiple components may be combined into one application and/or machine. Operations described with respect to one component may instead be performed by another component.

In one or more embodiments, a specimen 102 is an object (or a part of an object) to be studied and/or analyzed. In the field of life sciences, examples of specimens include tissues, cells, protein structures, and viruses. In the field of natural resources, examples of specimens include oil, gas, organic materials, and rocks. In the field of semiconductors, examples of specimens include crystalline materials, and semiconductor materials. Specimens in additional and/or alternative fields may be used.

In one or more embodiments, a microscope 104 is an optical instrument to better view objects that are difficult to see with the naked eye. Types of microscopes include transmission electron microscope (TEM), scanning electron microscope (SEM), scanning transmission electron microscope (STEM), focused ion beam microscope (FIB microscope), and scanning optical microscope. As used herein, the term "microscope" may also encompass detection systems such as Energy Dispersive Spectroscopy (EDS), and/or Electron Backscatter Diffraction (EBSD), Wavelength Dispersive Spectrometry (WDS), Micro X-ray Fluorescence (Micro-XRF), and/or X-ray Metrology.

In one or more embodiments, a microscope 104 is associated with one or more microscopy parameters 106. A microscopy parameter 106 is a configurable attribute of a microscope 104. Examples of microscopy parameters of a SEM include: an accelerating voltage (a voltage at which electrons are being accelerated as the electrons travel through an electron optical column); a convergence angle of the electron beam; a beam current; a spot size (a diameter of the beam spot on the specimen); a dwell time; and a resolution.

Different values for the various microscopy parameters result in images of different qualities and attributes. For example, higher magnification requires a smaller spot size. Higher signal-to-noise ratio and contrast resolution requires greater beam current. However, reducing the spot size also decreases the beam current.

In one or more embodiments, ANN 108 (also referred to as a deep learning system) is a machine-learning computing system. An ANN 108 includes a collection of connected units or nodes, which are called artificial neurons. Each connection transmits a signal from one artificial neuron to another. An artificial neuron that processes a received signal to transmit another signal to another artificial neuron. Artificial neurons may be aggregated into layers. Different layers may perform different kinds of transformations on their inputs.

One type of ANN is a convolutional neural network. Convolutional neural networks are designed to process data that come in the form of multiple arrays, such as a color image composed of three two-dimensional arrays containing pixel intensities in three color channels. An example architecture of a conventional neural network is structured as a series of stages. The first few stages are composed of two types of layers: convolutional layers and pooling layers. A convolutional layer applies a convolution operation to the input, passing the result to the next layer. The convolution emulates the response of an individual neuron to visual stimuli. A pooling layer combines the outputs of neuron clusters at one layer into a single neuron in the next layer. For example, max pooling uses the maximum value from each of a cluster of neurons at the prior layer. An example of a conventional neural network is the u-net. The u-net is described in Ronneberger et al., *U-Net: Convolutional Networks for Biomedical Image Segmentation*, MEDICAL IMAGE COMPUTING AND COMPUTER-ASSISTED INTERVENTION—MICCAI 2015, at 234-241 (2015), which is hereby incorporated by reference.

In one or more embodiments, an ANN 108 is configured to detect and/or identify objects of interest shown in a specimen image. An object of interest is a portion of the specimen that is under study. The remaining portions of the specimen provide context for an object of interest. However, the object of interest needs to be studied at a higher level of detail than the remaining portions of the specimen. As an example, cell membranes may be objects of interest within a specimen of a brain structure. Other examples of objects of interest include cell membranes or other parts of biological structures, particular neuronal structures, defects within crystalline structures, borders of crystalline structures, and structures within nanowires.

For each position within a specimen image, an ANN 108 determines a probability that the position shows an object of interest. The probability may also be referred to as a "prediction value." A prediction mask 110 indicates a prediction value for each position of a specimen image. Each position of the prediction mask 110 maps to a corresponding position within the specimen image. Based on the prediction mask 110, a scan mask 112 indicates which regions of the specimen image correspond to objects of interest, and which regions of the specimen do not correspond to objects of interest. Each position of the scan mask 112 maps to a corresponding position within the specimen image.

In one or more embodiments, an adaptive specimen image acquisition manager 114 refers to hardware and/or software configured to adapt a microscope 104 based on a scan mask 112 to generate a final specimen image 122. The scan mask 112 is generated based on results from an ANN 108. Examples of operations for adapting an adaptive specimen image acquisition system using an ANN are described below with reference to FIGS. 2A-B.

In an embodiment, an adaptive specimen image acquisition manager 114 is implemented on one or more digital devices. The term "digital device" generally refers to any hardware device that includes a processor. A digital device may refer to a physical device executing an application or a virtual machine. Examples of digital devices include a computer, a tablet, a laptop, a desktop, a netbook, a server, a web server, a network policy server, a proxy server, a generic machine, a function-specific hardware device, a mainframe, a television, a content receiver, a printer, a mobile handset, a smartphone, and/or a personal digital assistant (PDA).

In one or more embodiments, a data repository 116 is any type of storage unit and/or device (e.g., a file system, database, collection of tables, or any other storage mechanism) for storing data. Further, a data repository 116 may include multiple different storage units and/or devices. The multiple different storage units and/or devices may or may not be of the same type or located at the same physical site. Further, a data repository 116 may be implemented or may execute on the same computing system as a microscope 104, ANN 108, and/or merging module 114. Alternatively or additionally, a data repository 104 may be implemented or executed on a computing system separate from a microscope 104, ANN 108, and/or merging module 114. The data repository 104 may be communicatively coupled to the microscope 104, ANN 108, and/or merging module 114 via a direct connection or via a network.

Information describing a low-quality specimen image 118, a high-quality specimen image 120, and a final specimen image 122 may be implemented across any of components within a system 100. However, this information is illustrated within a data repository 116 for purposes of clarity and explanation.

In one or more embodiments, a specimen image (such as a low-quality specimen image 118 and a high-quality specimen image 120) is an image of a specimen 102 that is produced by microscope 104. Various specimen images (such as a low-quality specimen image 118 and a high-quality specimen image 120) may be produced by the same microscope 104 or different microscopes 104.

Image quality may be defined by, for example, resolution, magnification, number of pixels in the specimen image, size of pixels in the specimen image, and/or other attributes. A low-quality specimen image 118 and a high-quality specimen image 120, as referred to herein, may correspond to any two specimen images of differing qualities. Of the two specimen images, the image with the lower quality of the two specimen images may be referred to herein as the "low-quality specimen image 118" for purposes of explanation. The image with the higher quality of the two specimen images may be referred to herein as the "high-quality specimen image 120." The difference in quality between the low-quality specimen image 118 and the high-quality specimen image 120 may or may not be substantial.

A low-quality specimen image 118 may be produced using less time, energy, and/or other resources than a high-quality specimen image 120.

A specimen image may encompass a maximum area of a specimen that a microscope 104 is able to scan. As an example, a specimen image may show a rectangular or square area of a specimen. The entire rectangular or square area is covered by the scanning, without any holes in the rectangular or square area. Alternatively, a specimen image may show only a portion of the maximum area of a specimen that a microscope 104 is able to scan. As an example, a specimen image may show only a ring-shaped area of a specimen. The hole in the middle of the ring-shaped area is not scanned. The area surrounding the ring-shaped area is not scanned. The remaining areas of the specimen are not included in the specimen image, even if the remaining areas are within an area of the specimen that the microscope is able to scan.

A final specimen image 122 is generated based on at least two specimen images: a low-quality specimen image 118 and a high-quality specimen image 120. A final specimen image 122 may be, for example, a merger of a low-quality specimen image 118 and a high-quality specimen image 120.

Figure 1B:
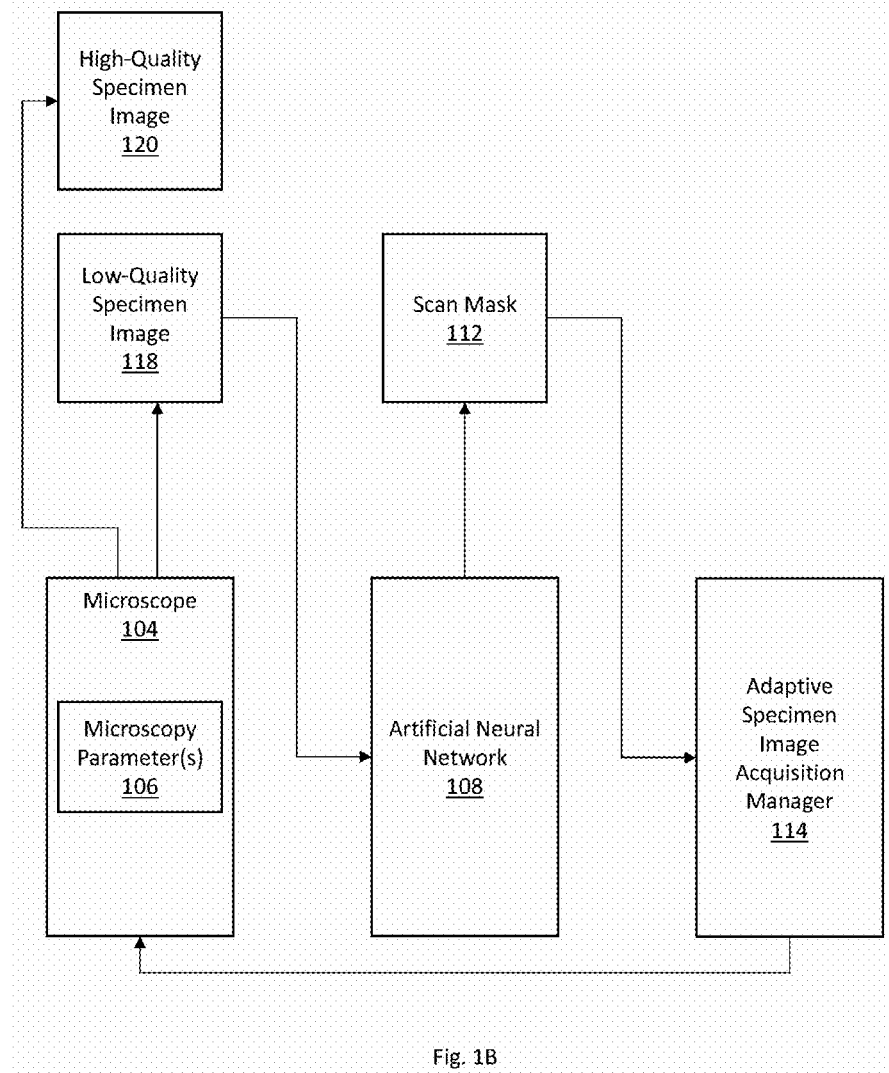
FIG. 1B illustrates an example process flow for an adaptive specimen image acquisition system, in accordance with one or more embodiments.

FIG. 1B illustrates an example process flow for an adaptive specimen image acquisition system, in accordance with one or more embodiments. Components labeled with the same numerals across FIGS. 1A-1C refer to similar components.

As illustrated, a microscope 104 is configured with a first set of values for a set of microscopy parameters 106. The microscope 104 scans a specimen using the first set of values for the microscopy parameters 106. The microscope 104 produces a low-quality specimen image 118.

The low-quality specimen image 118 is input to an ANN 108. The ANN 108 identifies objects of interest within the low-quality specimen image 118. A scan mask 112 is generated, indicating regions of the low-quality specimen image 118 corresponding to the objects of interest.

The scan mask 112 is input to an adaptive specimen image acquisition manager 114. The adaptive specimen image acquisition manager 114 configures the microscope 104 to scan only the regions corresponding to the objects of interest, as indicated by the scan mask 112. The adaptive specimen image acquisition manager 114 configures the microscope 104 to scan the regions indicated by the scan mask 112 using a second set of values for the microscopy parameters 106.

The microscope 104 scans the regions indicated by the scan mask 112 using the second set of values for the microscopy parameters 106. The microscope 104 produces a high-quality specimen image 120.

Hence, two specimen images are produced by the microscope 104. Information gathered from the first specimen image (the low-quality specimen image 118) is fed back into the system to generate the second specimen image (the high-quality specimen image 120). The microscope 104 is configured for producing the high-quality specimen image 120 based on the low-quality specimen image 118.

Figure 1C:
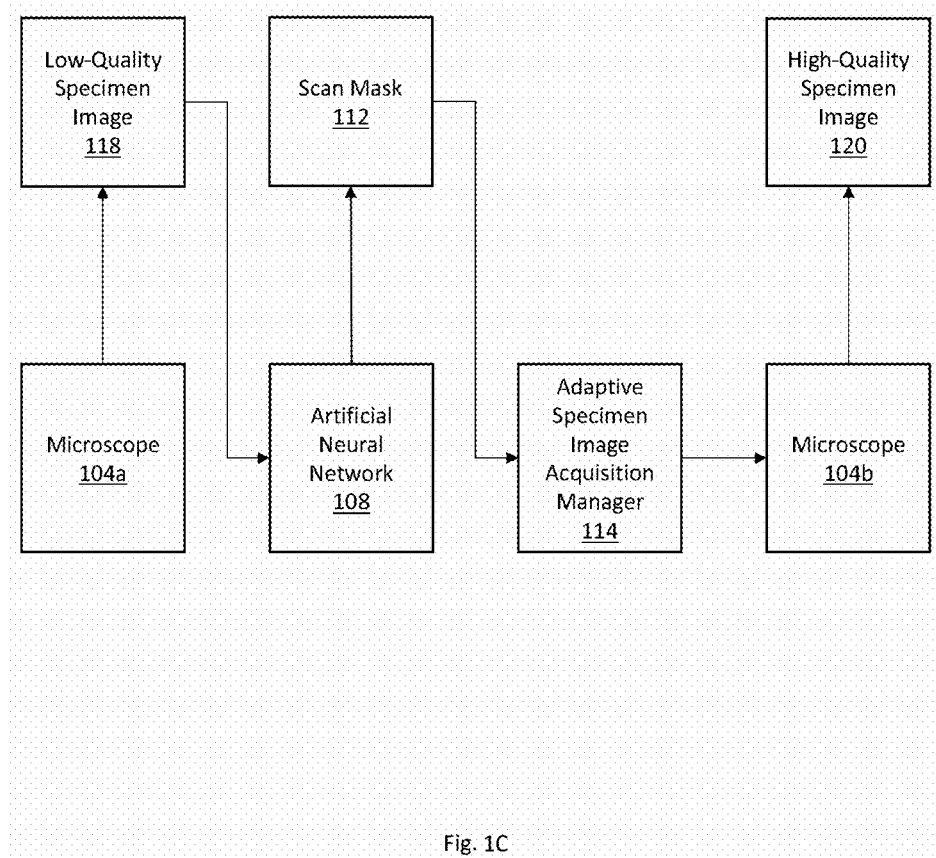
FIG. 1C illustrates another example process flow for an adaptive specimen image acquisition system, in accordance with one or more embodiments.

FIG. 1C illustrates another example process flow for an adaptive specimen image acquisition system, in accordance with one or more embodiments. Components labeled with the same numerals across FIGS. 1A-1C refer to similar components.

Microscopes 104*a-b* may refer to the same microscope, or different microscopes. Microscopes 104*a-b* may be of the same type, or different types. Microscopes 104*a-b* may be associated with the same set of microscopy parameters, or different sets of microscopy parameters.

Microscope 104*a* is configured with a first set of values for a first set of microscopy parameters. The first set of microscopy parameters may be, for example, parameters used in SEM scanning. Microscope 104*a* scans a specimen using the first set of values for the first set of microscopy parameters. Microscope 104*a* produces a low-quality specimen image 118.

The low-quality specimen image 118 is input to an ANN 108. The ANN 108 identifies objects of interest within the low-quality specimen image 118. A scan mask 112 is generated, indicating regions of the low-quality specimen image 118 corresponding to the objects of interest.

The scan mask 112 is input to an adaptive specimen image acquisition manager 114. The adaptive specimen image acquisition manager 114 configures microscope 104*b* to scan only the regions corresponding to the objects of interest, as indicated by the scan mask 112. The adaptive specimen image acquisition manager 114 configures microscope 104*b* to scan the regions indicated by the scan mask 112 using a second set of values for a second set of microscopy parameters. The second set of microscopy parameters may be, for example, parameters used in Energy Dispersive Spectroscopy (EDS), and/or Electron Backscatter Diffraction (EBSD).

Microscope 104*b* scans the regions indicated by the scan mask 112 using the second set of values for the second set of microscopy parameters. Microscope 104*b* produces a high-quality specimen image 120.

Hence, the two specimen images may be produced by different microscopes and/or detection systems. For example, the low-quality specimen image may be produced by a SEM, while the high-quality specimen image may be produced by EDS or another detection system.

Figure 2A:
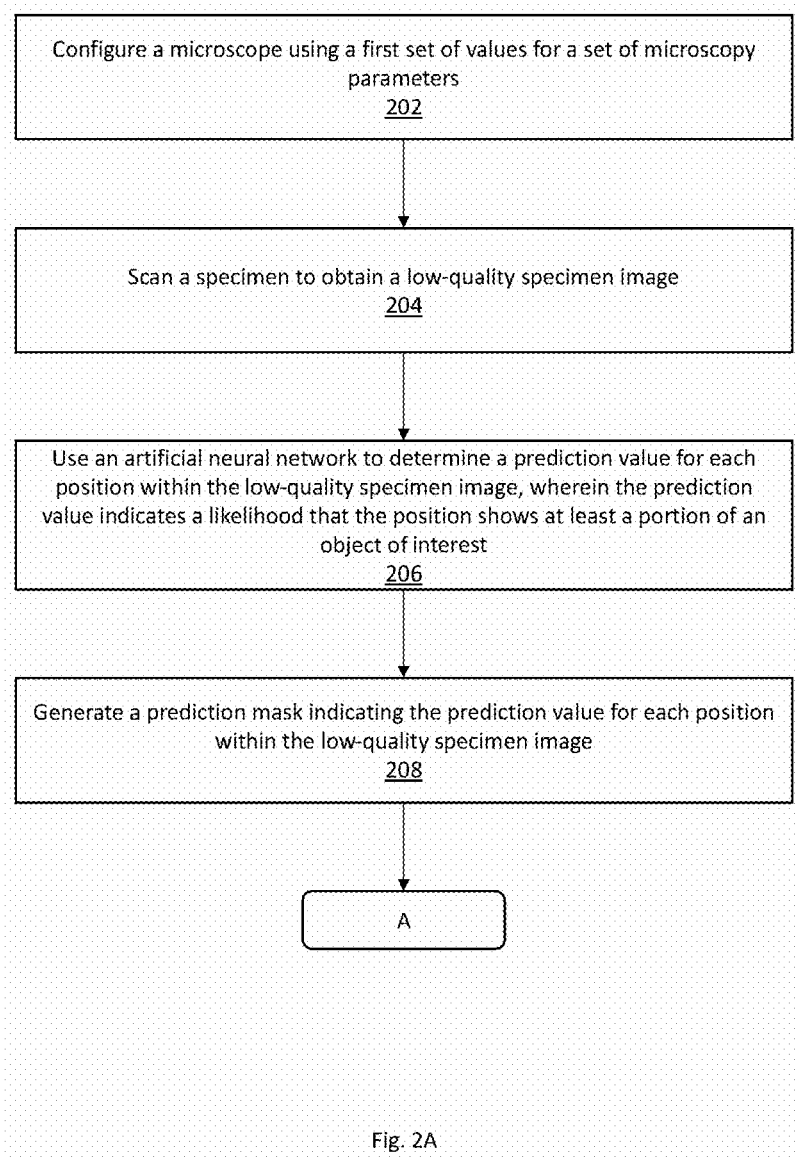
FIGS. 2A-B illustrate an example set of operations for adapting microscopy parameters of an adaptive specimen image acquisition system using an artificial neural network, in accordance with one or more embodiments.
Figure 2B:
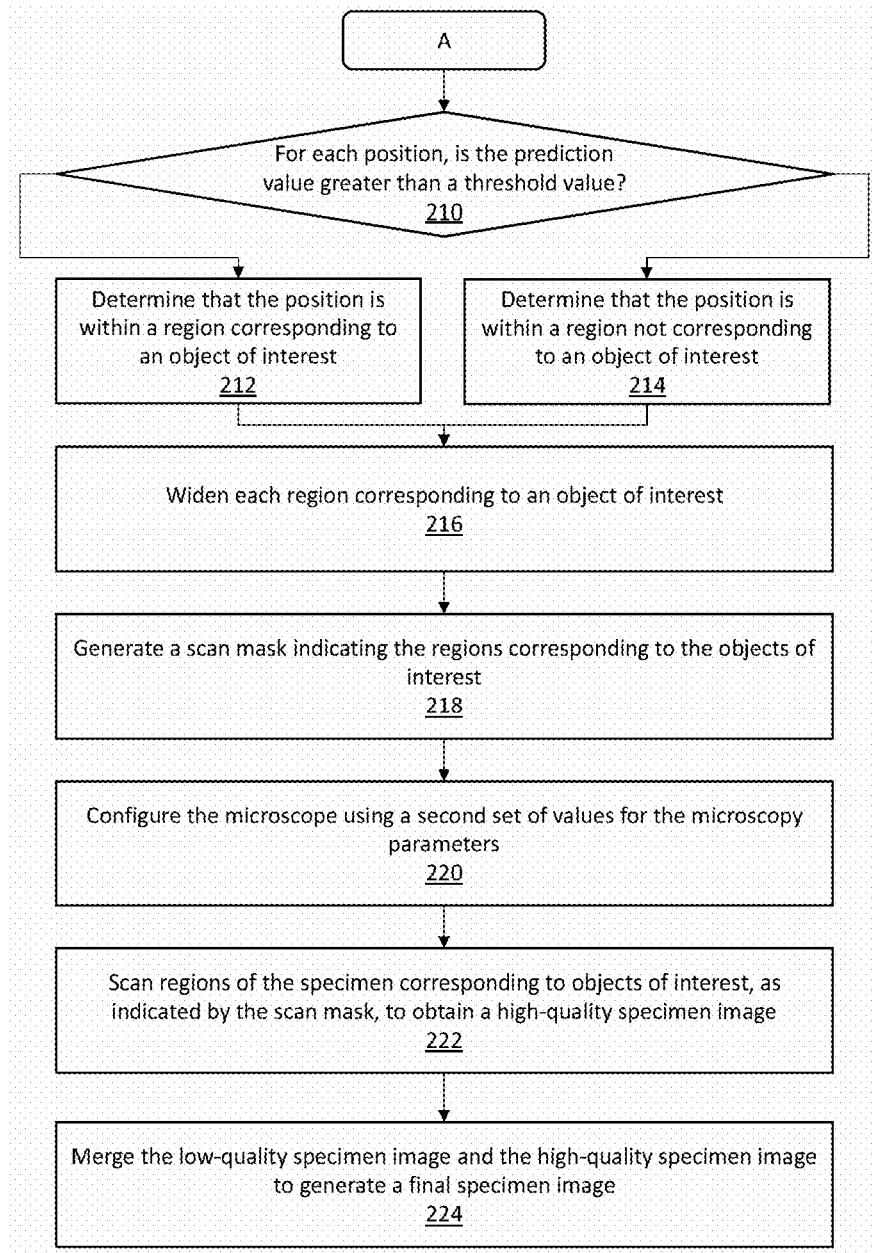

3. Adapting an Adaptive Specimen Image Acquisition System Using an Artificial Neural Network FIGS. 2A-B illustrate an example set of operations for adapting microscopy parameters of an adaptive specimen image acquisition system using an artificial neural network, in accordance with one or more embodiments. One or more operations illustrated in FIGS. 2A-B may be modified, rearranged, or omitted all together. Accordingly, the particular sequence of operations illustrated in FIGS. 2A-B should not be construed as limiting the scope of one or more embodiments.

One or more embodiments include configuring a microscope using a first set of values for a set of microscopy parameters (Operation 202). A microscope is configured using a first set of values for a set of microscopy parameters. The first set of values for the microscopy parameters may require scanning a specimen using more time, energy, and/or resources than a second set of values for the microscopy parameters, which is described below with reference to Operation 220.

One or more embodiments include scanning a specimen to obtain a low-quality specimen image (Operation 204). The microscope scans a specimen using the first set of values for the microscopy parameters. Based on the scanning, a specimen image is generated. The specimen image is referred to as a "low-quality specimen image," because the specimen image has a lower quality than a later-obtained "high-quality specimen image," which is described below with reference to Operation 222.

One or more embodiments include using an ANN to determine a prediction value for each position within the low-quality specimen image, wherein the prediction value indicates a likelihood that the position shows at least a portion of an object of interest (Operation 206). An ANN receives the low-quality specimen image as an input. The ANN determines a prediction value for each position within the low-quality specimen image. As an example, a u-net convolution neural network may be applied to a specimen image to identify neuronal structures within the specimen image. The u-net convolution network may determine a likelihood that each position within the specimen image shows at least a portion of a particular neuronal structure.

One or more embodiments include generating a prediction mask indicating the prediction value for each position within the low-quality specimen image (Operation 208). A prediction mask is generated. Each position within the prediction mask is associated with a respective prediction value. An association between (a) a particular position within the prediction mask, and (b) a respective prediction value for a corresponding position within the low-quality specimen image, is stored.

One or more embodiments include determining whether the prediction value, for each position, is greater than a threshold value (Operation 210). In preparation for generating a scan mask, the prediction value for each position within the prediction mask is compared with a threshold value.

In an embodiment, the threshold value is fixed across all positions in a specimen image. In another embodiment, the threshold value adaptively changes across the positions in a specimen image. The threshold values for different positions within the specimen image are different. Threshold values may be determined based on a local histogram, a neighbor pixel distribution, and/or any other methods.

If the prediction value for a position is greater than the threshold value, then one or more embodiments include determining that the position is within a region corresponding to an object of interest (Operation 212). The position is determined to be within a region corresponding to an object of interest within a scan mask, later generated at Operation 218.

If the prediction value for a position is less than the threshold value, then one or more embodiments include determining that the position is within a region not corresponding to an object of interest (Operation 214). The position is determined to be within a region not corresponding to an object of interest within the scan mask, later generated at Operation 218.

One or more embodiments include widening each region corresponding to an object of interest (Operation 216). Each region that has been determined as corresponding to an object of interest at Operation 212 is widened to include adjacent areas. Various ways of widening may be used.

In an embodiment, each region that has been determined as corresponding to an object of interest at Operation 212 may be widened by a fixed value. As an example, each region may be widened by 0.5 nm.

In an embodiment, each region that has been determined as corresponding to an object of interest at Operation 212 may be widened by a particular percentage of the current width of the region. As an example, a particular region may be determined as corresponding to an object of interest based on prediction values with a prediction mask. The particular region may have a width of 10 nm. The particular region may be widened by 10 percent. Hence the particular region may be enlarged to have a width of 11 nm.

In an embodiment, the size of the widening may be determined based on a variety of factors. As an example, the size may be determined based on the prediction values. A larger widening may be used for regions associated with greater prediction values. A smaller widening may be used for regions associated with lesser prediction values.

One or more embodiments include generating a scan mask indicating the regions corresponding to the objects of interest (Operation 218). A scan mask is generated based on Operations 212-216. Regions corresponding to one or more objects of interest include the regions identified at Operation 212 and Operation 216. Regions not corresponding to any objects of interest include regions identified at Operation 214.

One or more embodiments include configuring the microscope using a second set of values for the microscopy parameters (Operation 220). The microscope is configured using a second set of values for the microscopy parameters. As described above with reference to Operation 202, the first set of values for the microscopy parameters may require scanning a specimen using more time, energy, and/or resources than the second set of values for the microscopy parameters.

One or more embodiments include scanning regions of the specimen corresponding to objects of interest, as indicated by the scan mask, to obtain a high-quality specimen image (Operation 222). The scan mask serves as a filter to determine which regions of the specimen to scan and which regions of the specimen not to scan. The microscope selectively scans the specimen based on the scan mask. In particular, the microscope scans the regions corresponding to objects of interest using the second set of values for the microscopy parameters. The microscope does not scan the regions not corresponding to any objects of interest.

Based on the scanning, a specimen image is generated. The specimen image is referred to as a "high-quality specimen image," because the specimen image has a higher quality than the previously-obtained "low-quality specimen image," which is described above with reference to Operation 204. The high-quality specimen image is associated with a higher quality because the high-quality specimen image was obtained using the second set of values for the microscopy parameters. The low-quality specimen image is associated with a lower quality because the low-quality specimen image was obtained using the first set of values for the microscopy parameters.

Based on the first set of values for the microscopy parameters and the second set of values for the microscopy parameters, the time needed for scanning a particular area (such as a pixel) of the specimen is different. The time needed for scanning a particular area of the specimen using the first set of values for the microscopy parameters may be less than the time needed for scanning the particular area of the specimen using the second set of values for the microscopy parameters. As an example, the time needed for scanning a particular area of the specimen using the first set of values for the microscopy parameters may be between 100 nanoseconds and 1 microsecond. The time needed for scanning the particular area of the specimen using the second set of values for the microscopy parameters may be 10 to 13 microseconds.

One or more embodiments include merging the low-quality specimen image and the high-quality specimen image to generate a final specimen image (Operation 224). Various ways of merging the low-quality specimen image and the high-quality specimen image may be used.

In an embodiment, data for each position that was scanned in the high-quality specimen image is copied from the high-quality specimen image into the final specimen image. Data for the remaining positions is copied from the low-quality specimen image into the final specimen image.

As an example, a high-quality specimen image may have a higher resolution than a low-quality specimen image. Data for all scanned areas in the high-quality specimen image may be copied into the final specimen image. The copied data retain the higher resolution of the high-quality specimen image in the final specimen image. Meanwhile, data for the remaining areas may be copied from the low-quality specimen image into the final specimen image. The copied data has the lower resolution of the low-quality specimen image in the final specimen image. Hence, the final specimen image has portions that are of a higher resolution and other portions that are of a lower resolution.

In an embodiment, the low-quality specimen image is used as a base for generating the final specimen image. For each position that scanned in the high-quality specimen image, data in the high-quality specimen image overwrites data in the low-quality specimen image.

As an example, overwriting a low-quality specimen image may involve using a scan mask. Positions that are within regions corresponding to objects of interest, as indicated by the scan mask, may be identified. Data values for the identified positions from the high-quality specimen image may be determined. The data values may be copied from the respective positions in the high-quality specimen image to the same respective positions in the low-quality specimen image.

In an embodiment, a weighted merging is performed on the low-quality specimen image and the high-quality specimen image. Positions that are within regions corresponding to objects of interest, as indicated by the scan mask, are identified. Prediction values for the identified positions are determined based on the prediction mask. Weights associated with the respective positions are determined based on the prediction value for the respective position. As an example, a higher weight is determined for a higher prediction value, and a lower weight is determined for a lower prediction value. The weight associated with a respective position is applied to the data value for the respective position from the high-quality specimen image. As an example, applying a weight to a data value for a particular position may involve reducing a resolution of the image portion at the particular position by a certain factor. Hence, weighted data values for all scanned positions in the high-quality specimen image are obtained. The weighted data values for the respective positions overwrite the data values for the same respective positions in the low-quality specimen image.

4. Example Embodiment

A detailed example is described below for purposes of clarity. Components and/or operations described below should be understood as one specific example which may not be applicable to certain embodiments. Accordingly, components and/or operations described below should not be construed as limiting the scope of any of the claims.

FIGS. 3A-F illustrate an example for adapting microscopy parameters of an adaptive specimen image acquisition system using an artificial neural network, in accordance with one or more embodiments. The specimen may be a brain structure. Objects of interest may include cell membranes within the brain structure.

Figure 3A:
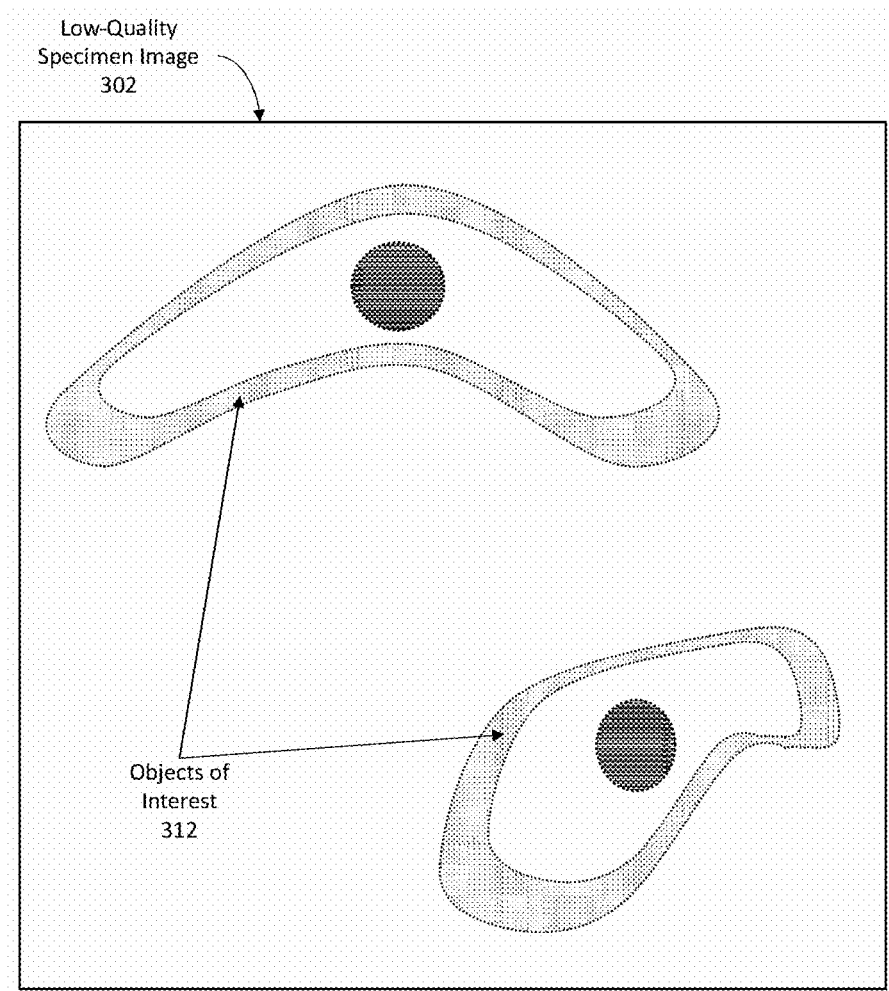
FIG. 3A illustrates an example of a low-quality specimen image, in accordance with one or more embodiments.

FIG. 3A illustrates an example of a low-quality specimen image. A microscope is configured using a first set of values for a set of microscopy parameters. For example, a particular dwell time and a particular beam current may be used. Using the first set of values for the microscopy parameters, the microscope scans a maximum scannable area of the specimen. The low-quality specimen image 302 is produced. The low-quality specimen image 302 shows particular cell membranes within the brain structure, which are marked as objects of interest 312. The low-quality specimen image 302 also shows other structures within the brain structure, which are not objects of interest.

Figure 3B:
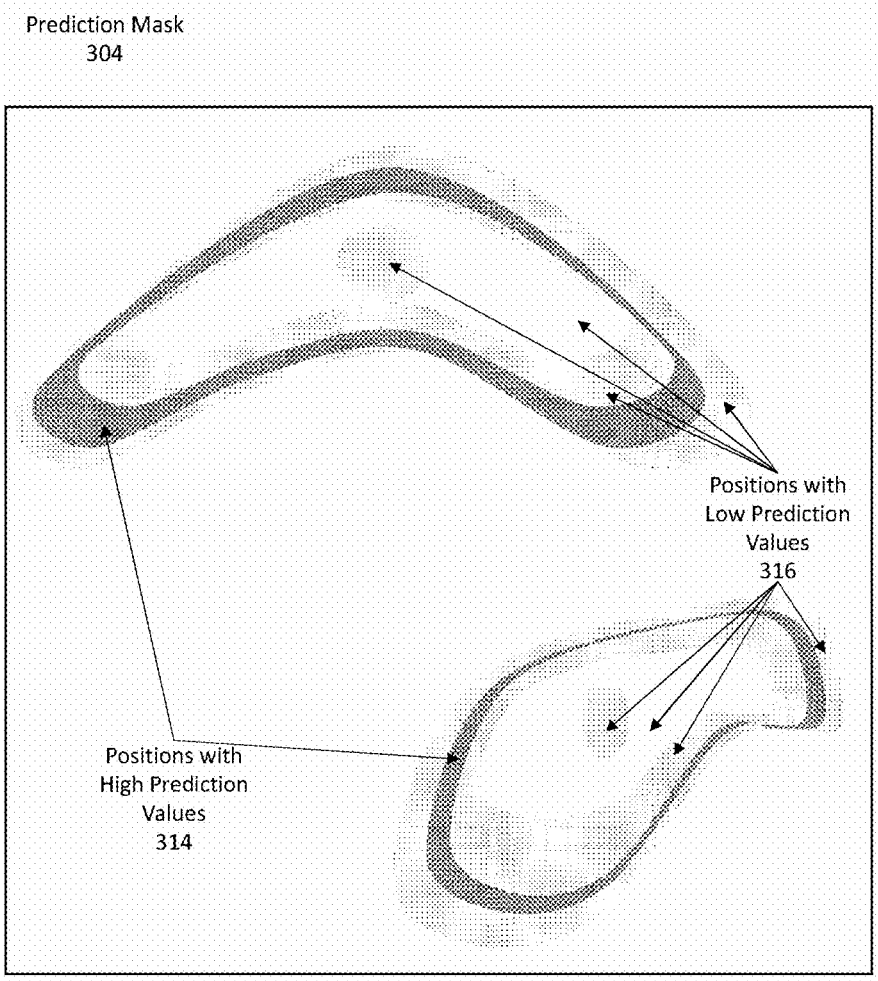
FIG. 3B illustrates an example of a prediction mask, in accordance with one or more embodiments.

FIG. 3B illustrates an example of a prediction mask. The low-quality specimen image 302 is input to an ANN. The ANN determines a prediction value for each position of the low-quality specimen image 302. A prediction mask 304 is generated. As illustrated, certain positions (heavily-dotted areas) 314 are determined to have high prediction values. Other positions (lightly-dotted areas and white areas) 316 are determined to have low prediction values. The white areas may be associated with even lower prediction values than the lightly-dotted areas. As illustrated, positions 314 with high prediction values in the prediction mask 304 correspond roughly to the objects of interest 312 shown in the low-quality specimen image 302. Positions 316 with low prediction values in the prediction mask 304 correspond roughly to the remaining areas shown in the low-quality specimen image 302.

Figure 3C:
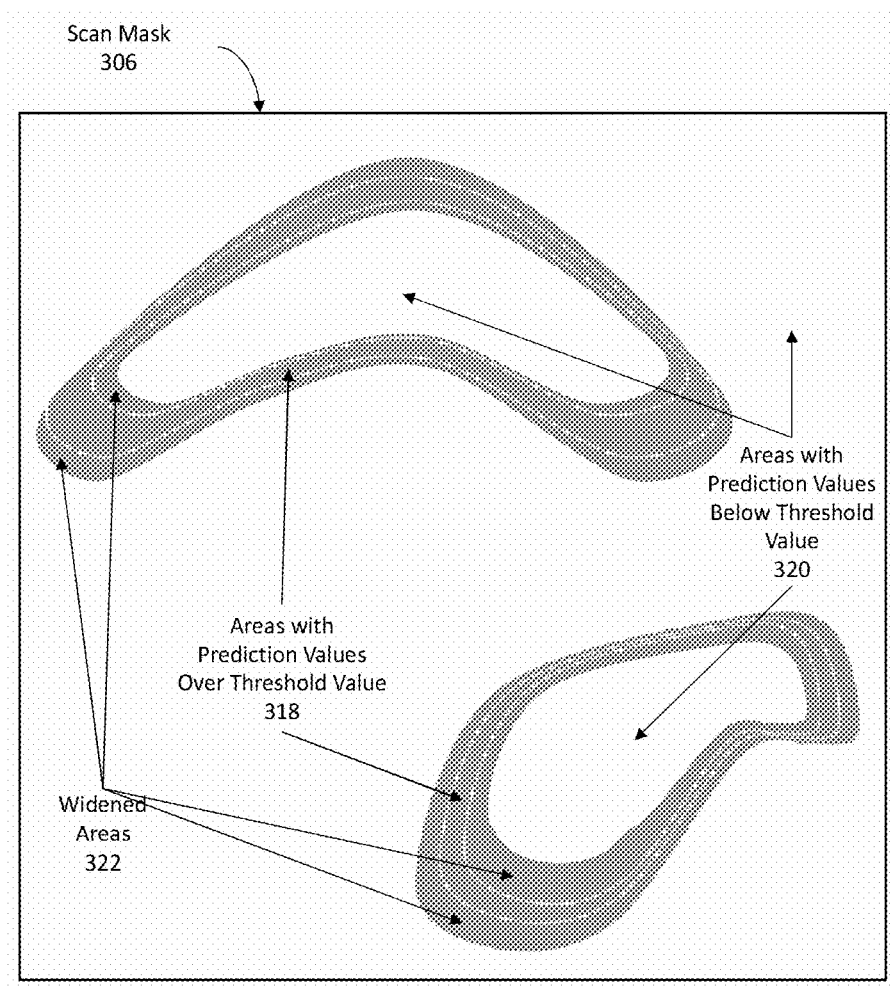
FIGS. 3C-D illustrate an example of a scan mask, in accordance with one or more embodiments.
Figure 3D:
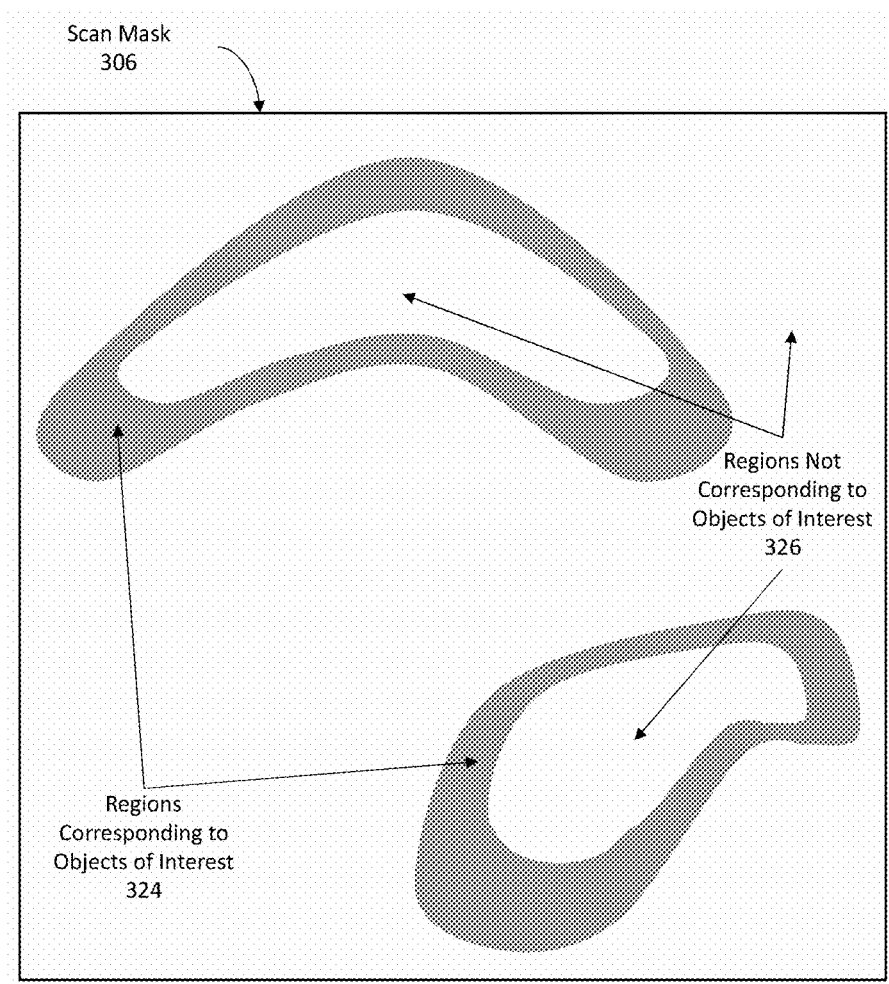

FIGS. 3C-D illustrate an example of a scan mask. The prediction values within the prediction mask 304 are compared with a threshold value. Based on the comparison, a scan mask 306 is generated. Referring to FIG. 3C, certain positions (grey areas) 318 are associated with prediction values that are above the threshold value. Certain positions (white areas) 320 are associated with prediction values that are below the threshold value. As illustrated, the areas 318 with prediction values above the threshold value, within the scan mask 306, correspond to the positions 314 with high prediction values, within the prediction mask 304. The areas 320 with prediction values below the threshold value, within the scan mask 306, correspond to the positions 316 with low prediction values, within the prediction mask 304.

Additionally, the areas 318 with prediction values above the threshold value are widened to include adjacent areas. As illustrated, the widened areas (grey areas) 322 surround the areas 318 with prediction values above the threshold value.

Referring to FIG. 3D, the final scan mask 306 is illustrated. All grey areas shown in FIG. 3C are determined as regions 324 corresponding to objects of interest. All white areas shown in FIG. 3C are determined as regions 326 not corresponding to objects of interest.

Figure 3E:
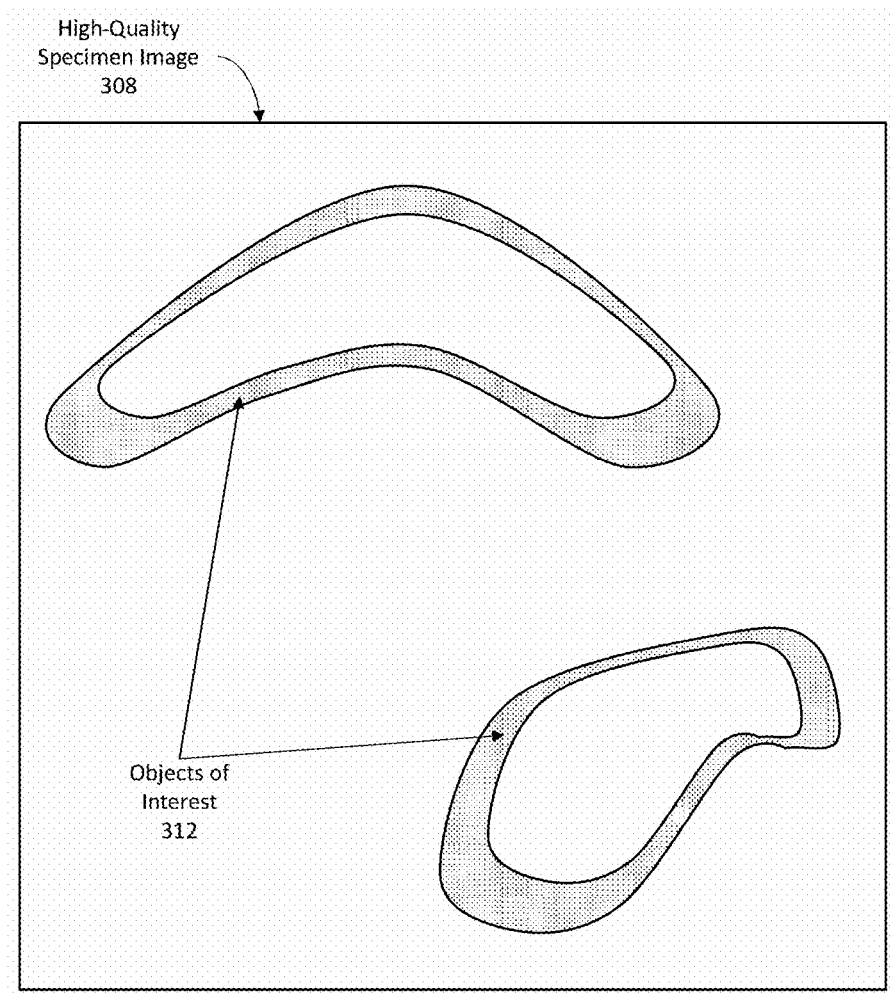
FIG. 3E illustrates an example of a high-quality specimen image, in accordance with one or more embodiments.

FIG. 3E illustrates an example of a high-quality specimen image. The microscope is configured using a second set of values for the microscopy parameters. For example, a higher dwell time and a greater beam current (as compared to that used for producing the low-quality specimen image 302) may be used. Using the second set of values for the microscopy parameters, the microscope selectively scans the specimen based on the scan mask 306. The microscope scans the regions 324 corresponding to the objects of interest. The microscope does not scan the regions 326 not corresponding to the objects of interest. The high-quality specimen image 308 is produced. The high-quality specimen image 308 shows the cell membranes within the brain structure, which are marked as objects of interest 312. The objects of interest 312 within the high-quality specimen image 308 are shown in a higher quality than the objects of interest 312 within the low-quality specimen image 302. For example, the objects of interest 312 in the high-quality specimen image 308 may be shown with a higher resolution (for example, a larger number of pixels) than the objects of interest 312 in the low-quality specimen image 302. The high-quality specimen image 308 does not show other structures within the brain structure, because the remaining areas were not scanned.

Figure 3F:
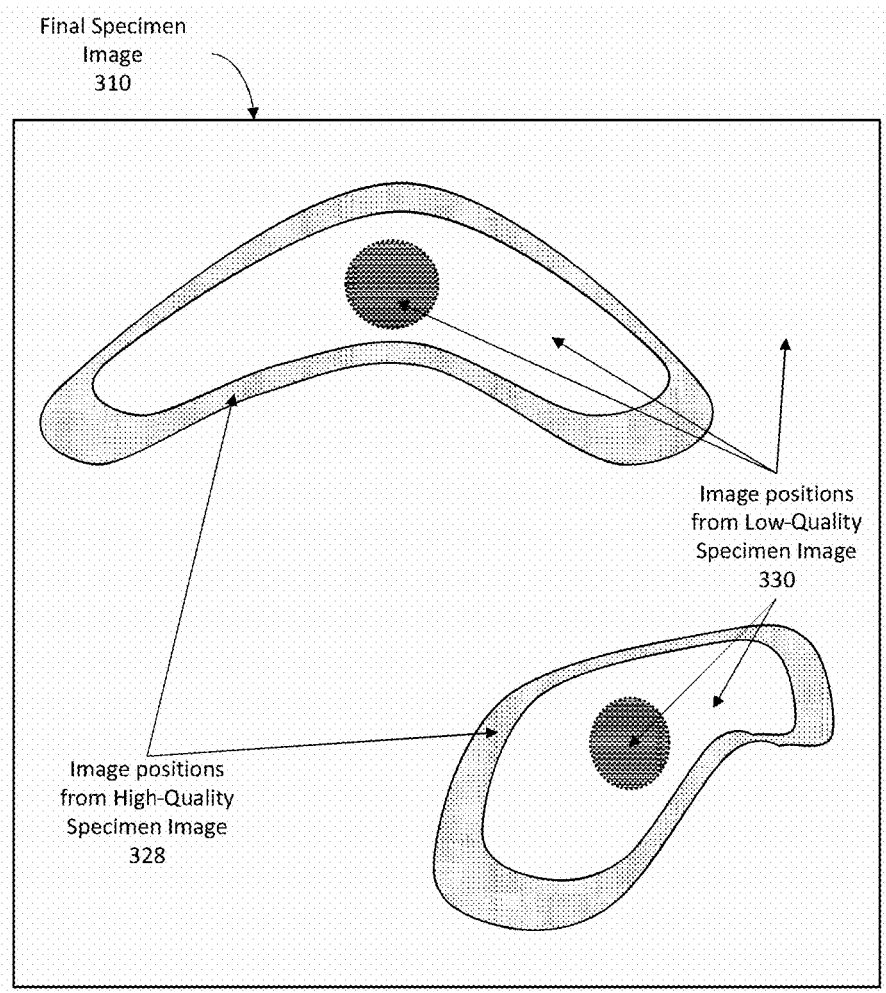
FIG. 3F illustrates an example of a final specimen image, in accordance with one or more embodiments.

FIG. 3F illustrates an example of a final specimen image. The low-quality specimen image 302 and the high-quality specimen image 308 are merged to obtain the final specimen image 310. Data for positions 328 that were scanned in the high-quality specimen image 308 are taken from the high-quality specimen image 308. Data for positions 330 that were not scanned in the high-quality specimen image 308 are taken from the low-quality specimen image 302. Hence, the objects of interest 312 captured in the high-quality specimen image 308 are copied from the high-quality specimen image 308 into the final specimen image 310. Other structures captured in the low-quality specimen image 302 are copied from the low-quality specimen image 302 into the final specimen image 310. In particular, the round spots (striped area) are structures that are not objects of interest. The round spots are not shown in the high-quality specimen image 308. The round spots are copied from the low-quality specimen image 302 into the final specimen image 310.

5. Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs), field programmable gate arrays (FPGAs), or network processing units (NPUs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, FPGAs, or NPUs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 4 is a block diagram that illustrates a computer system 400 upon which an embodiment of the invention may be implemented. Computer system 400 includes a bus 402 or other communication mechanism for communicating information, and a hardware processor 404 coupled with bus 402 for processing information. Hardware processor 404 may be, for example, a general purpose microprocessor.

Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk or optical disk, is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 410. Volatile media includes dynamic memory, such as main memory 406. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infra-red data communications.

Various forms of media may be involved in carrying one or more sequences of one or more instructions to processor 404 for execution. For example, the instructions may initially be carried on a magnetic disk or solid state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

6. Miscellaneous; Extensions

Embodiments are directed to a system with one or more devices that include a hardware processor and that are configured to perform any of the operations described herein and/or recited in any of the claims below.

In an embodiment, a non-transitory computer readable storage medium comprises instructions which, when executed by one or more hardware processors, causes performance of any of the operations described herein and/or recited in any of the claims.

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

The invention claimed is:

1. A method, comprising:
    obtaining a first image of a specimen that is produced by scanning the specimen using a first set of one or more values for a set of one or more microscopy parameters;
    using an artificial neural network to identify one or more objects of interest within the first image;
    generating a scan mask indicating a first set of one or more regions corresponding to the objects of interest identified using the artificial neural network; and
    based on the scan mask, providing instructions to scan the first set of regions of the specimen using a second set of values for the set of microscopy parameters to obtain a second image of the specimen,
    wherein the method is performed by at least one device including a hardware processor.

2. The method of claim 1, wherein the scan mask further indicates a second set of one or more regions not corresponding to the objects of interest identified using the artificial neural network; and
    further comprising: based on the scan mask, refraining from providing any instructions to scan the second set of regions of the specimen using the second set of values for the set of microscopy parameters.

3. The method of claim 1, wherein the first set of regions in the scan mask includes: (a) areas of the objects of interest within the first image, and (b) regions adjacent to the areas of the objects of interest within the first image.

4. The method of claim 1, further comprising: overwriting a portion of the first image with data from the second image to obtain a combined image.

5. The method of claim 4, wherein overwriting the portion of the first image with data from the second image comprises:
    determining that a particular position in the first image is within the first set of regions of the scan mask;
    determining a data value for the particular position in the second image; and
    copying the data value from the particular position in the second image to the particular position in the first image.

6. The method of claim 4, wherein overwriting the portion of the first image with data from the second image comprises:
    determining that a particular position in the first image is within the first set of regions of the scan mask, wherein the scan mask is generated from a prediction mask output from the artificial neural network;
    determining a prediction value for the particular position based on the prediction mask;
    determining a weight to be applied to a data value for the particular position in the second image based on the prediction value for the particular position based on the prediction mask;
    applying the weight to the data value for the particular position in the second image to obtain a weighted data value; and
    overwriting the particular position in the first image with the weighted data value.

7. The method of claim 1, further comprising:
    generating a prediction mask, based on the artificial neural network, that indicates one or more areas of the objects of interest; and
    generating the scan mask based on the prediction mask.

8. The method of claim 7, wherein generating the scan mask based on the prediction mask comprises:
comparing a prediction value for a particular position in the prediction mask with a threshold value;
responsive to determining that the prediction value for the particular position in the prediction mask is above the threshold value: determining that the particular position is within the first set of regions, in the scan mask, corresponding to the objects of interest identified using the artificial neural network; and
responsive to determining that the prediction value for the particular position in the prediction mask is below the threshold value: determining that the particular position is within a second set of regions, in the scan mask, not corresponding to the objects of interest identified using the artificial neural network.

9. The method of claim 1, further comprising:
scanning the specimen using the first set of values for the set of microscopy parameters.

10. The method of claim 1, further comprising:
scanning the specimen using the second set of values for the set of microscopy parameters.

11. The method of claim 1, wherein the instructions are provided to an electron microscope.

12. The method of claim 1, wherein the set of microscopy parameters comprises one or more of:
a dwell time;
a resolution;
an accelerating voltage;
a beam current;
a convergence angle; and
a spot size.

13. A non-transitory computer readable medium comprising instructions which, when executed by one or more hardware processors, cause performance of operations as recited in claim 1.

14. A system, comprising:
at least one device including a hardware processor; and
the system being configured to perform operations as recited in claim 1.

15. A system comprising:
an electron microscope configured to obtain images of a specimen based on one or more sets of microscope parameters; and
a non-transitory computer readable medium coupled to or included with the electron microscope, the non-transitory computer readable medium comprising instructions which, when executed by one or more hardware processors, cause the electron microscope to:
obtain a first image of a specimen that is produced by scanning the specimen using a first set of one or more values for a set of one or more microscopy parameters;
use an artificial neural network to identify one or more objects of interest within the first image;
generate a scan mask indicating a first set of one or more regions corresponding to the objects of interest identified using the artificial neural network; and
based on the scan mask, provide instructions to scan the first set of regions of the specimen using a second set of values for the set of microscopy parameters to obtain a second image of the specimen.

16. The system of claim 15, wherein the first set of regions in the scan mask includes: (a) areas of the objects of interest within the first image, and (b) regions adjacent to the areas of the objects of interest within the first image.

17. The system of claim 15, wherein the non-transitory computer readable medium further comprises instructions which, when executed by one or more hardware processors, cause the electron microscope to:
determine that a particular position in the first image is within the first set of regions of the scan mask;
determine a data value for the particular position in the second image; and
copy the data value from the particular position in the second image to the particular position in the first image.

18. The system of claim 15, wherein the non-transitory computer readable medium further comprises instructions which, when executed by one or more hardware processors, cause the electron microscope to:
generate a prediction mask, based on the artificial neural network, that indicates one or more areas of the objects of interest; and
generate the scan mask based on the prediction mask.

19. The system of claim 18, wherein the non-transitory computer readable medium further comprises instructions which, when executed by one or more hardware processors, cause the electron microscope to:
compare a prediction value for a particular position in the prediction mask with a threshold value;
responsive to determining that the prediction value for the particular position in the prediction mask is above the threshold value, determine that the particular position is within the first set of regions, in the scan mask, corresponding to the objects of interest identified using the artificial neural network; and
responsive to determining that the prediction value for the particular position in the prediction mask is below the threshold value, determine that the particular position is within a second set of regions, in the scan mask, not corresponding to the objects of interest identified using the artificial neural network.

20. The system of claim 15, wherein the set of microscopy parameters comprises one or more of:
a dwell time;
a resolution;
an accelerating voltage;
a beam current;
a convergence angle; and
a spot size.

* * * * *

(12) EX PARTE REEXAMINATION CERTIFICATE (12355th)
United States Patent
Potocek

(10) Number: US 10,928,335 C1
(45) Certificate Issued: Aug. 14, 2023

(54) ADAPTIVE SPECIMEN IMAGE ACQUISITION USING AN ARTIFICIAL NEURAL NETWORK

(71) Applicant: FEI Company, Hillsboro, OR (US)

(72) Inventor: Pavel Potocek, Eindhoven (NL)

(73) Assignee: FEI COMPANY, Hillsboro, OR (US)

Reexamination Request:
No. 90/019,140, Dec. 12, 2022

Reexamination Certificate for:
Patent No.: 10,928,335
Issued: Feb. 23, 2021
Appl. No.: 16/516,837
Filed: Jul. 19, 2019

(30) Foreign Application Priority Data

Jul. 19, 2018 (EP) .................................. 18184339

(51) Int. Cl.
*G01N 23/2251* (2018.01)
*H01J 37/28* (2006.01)
*H01J 37/26* (2006.01)

(52) U.S. Cl.
CPC ........ *G01N 23/2251* (2013.01); *H01J 37/265* (2013.01); *H01J 37/28* (2013.01); *G01N 2223/401* (2013.01); *G01N 2223/408* (2013.01); *G01N 2223/418* (2013.01)

(58) Field of Classification Search
None
See application file for complete search history.

(56) References Cited

To view the complete listing of prior art documents cited during the proceeding for Reexamination Control Number 90/019,140, please refer to the USPTO's Patent Electronic System.

*Primary Examiner* — James A Menefee

(57) ABSTRACT

Techniques for adapting an adaptive specimen image acquisition system using an artificial neural network (ANN) are disclosed. An adaptive specimen image acquisition system is configurable to scan a specimen to produce images of varying qualities. An adaptive specimen image acquisition system first scans a specimen to produce a low-quality image. An ANN identifies objects of interest within the specimen image. A scan mask indicates regions of the image corresponding to the objects of interest. The adaptive specimen image acquisition system scans only the regions of the image corresponding to the objects of interest, as indicated by the scan mask, to produce a high-quality image. The low-quality image and the high-quality image are merged in a final image. The final image shows the objects of interest at a higher quality, and the rest of the specimen at a lower quality.

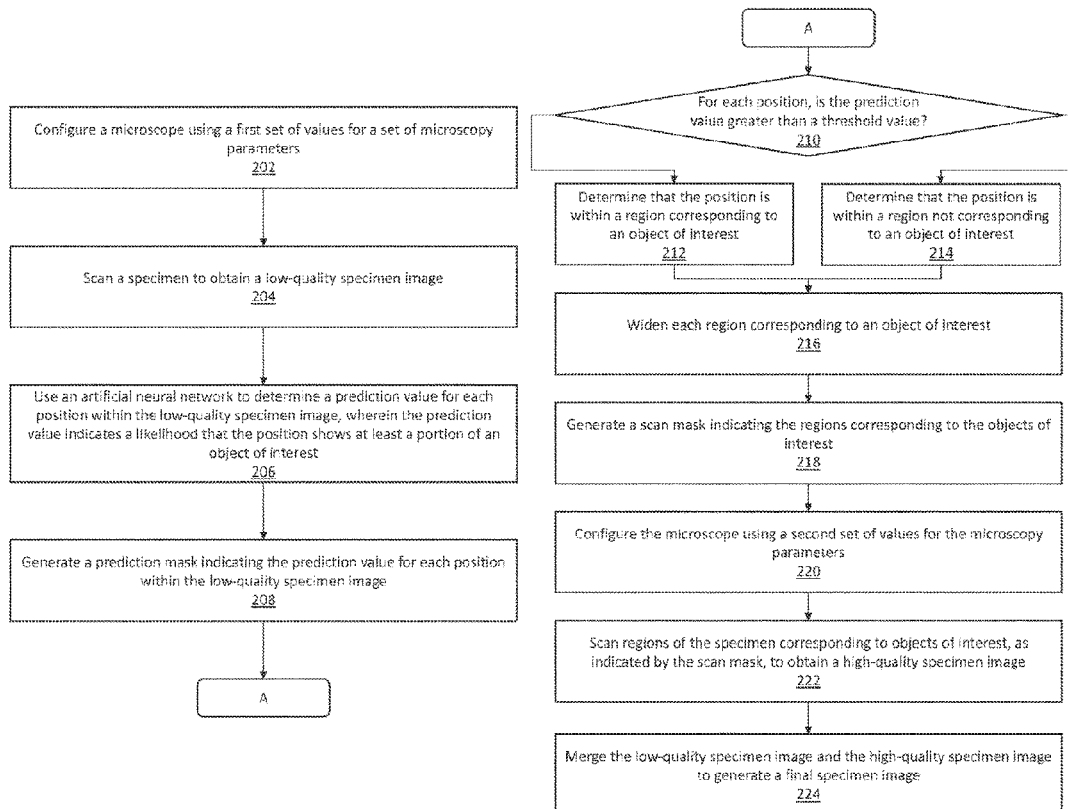

EX PARTE
REEXAMINATION CERTIFICATE

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 4-6 are cancelled.

Claims 1, 7 and 8 are determined to be patentable as amended.

Claims 2, 3 and 9-14, dependent on an amended claim, are determined to be patentable.

New claims 21-24 are added and determined to be patentable.

Claims 15-20 were not reexamined.

1. A method, comprising:
    obtaining a first image of a specimen that is produced by scanning the specimen using a first set of one or more values for a set of one or more microscopy parameters;
    using an artificial neural network to identify one or more objects of interest within the first image;
    generating a scan mask indicating a first set of one or more regions corresponding to the objects of interest identified using the artificial neural network; [and]
    based on the scan mask, providing instructions to scan the first set of regions of the specimen using a second set of values for the set of microscopy parameters to obtain a second image of the specimen, wherein the method is performed by at least one device including a hardware processor; *and*
    *overwriting a portion of the first image with data from the second image to obtain a combined image wherein overwriting the portion of the first image with data from the second image comprises:*
        *determining that a particular position in the first image is within the first set of regions of the scan mask, wherein the scan mask is generated from a prediction mask output from the artificial neural network;*
        *determining a prediction value for the particular position based on the prediction mask;*
        *determining a weight to be applied to a data value for the particular position in the second image based on the prediction value for the particular position based on the prediction mask;*
        *applying the weight to the data value for the particular position in the second image to obtain a weighted data value; and*
        *overwriting the particular position in the first image with the weighted data value.*

7. The method of claim 1, further comprising:
    generating [a] *the* prediction mask, based on the artificial neural network, that indicates one or more areas of the objects of interest; and
    generating the scan mask based on the prediction mask.

8. The method of claim 7, wherein generating the scan mask based on the prediction mask comprises:
    comparing a *respective* prediction value for [a particular] *each individual* position in the prediction mask with a threshold value;
    responsive to determining that the prediction value for [the particular] *an individual* position in the prediction mask is above the threshold value: determining that the [particular] individual position is within the first set of regions, in the scan mask, corresponding to the objects of interest identified using the artificial neural network; and
    responsive to determining that the prediction value for the [particular] *said individual* position in the prediction mask is below the threshold value: determining that the [particular] *said individual* position is within a second set of regions, in the scan mask, not corresponding to the objects of interest identified using the artificial neural network.

*21. A system, comprising:*
    *an electron microscope configured to obtain images of a specimen based on one or more sets of microscope parameters; and*
    *a non-transitory computer readable medium coupled to or included with the electron microscope, the non-transitory computer readable medium comprising instructions which, when executed by one or more hardware processors, cause the electron microscope to:*
        *obtain a first image of a specimen that is produced by scanning the specimen using a first set of one or more values for a set of one or more microscopy parameters;*
        *use an artificial neural network to identify one or more objects of interest within the first image;*
        *generate a scan mask indicating a first set of one or more regions corresponding to the objects of interest identified using the artificial neural network;*
        *based on the scan mask, provide instructions to scan the first set of regions of the specimen using a second set of values for the set of microscopy parameters to obtain a second image of the specimen; and*
        *overwrite a portion of the first image with data from the second image to obtain a combined image, wherein overwriting the portion of the first image with data from the second image comprises:*
            *determining that a particular position in the first image is within the first set of regions of the scan mask, wherein the scan mask is generated from a prediction mask output from the artificial neural network;*
            *determining a prediction value for the particular position based on the prediction mask;*
            *determining a weight to be applied to a data value for the particular position in the second image based on the prediction value for the particular position based on the prediction mask;*
            *applying the weight to the data value for the particular position in the second image to obtain a weighted data value; and*
            *overwriting the particular position in the first image with the weighted data value.*

*22. The system of claim 21, wherein the non-transitory computer readable medium further comprises instructions which, when executed by one or more hardware processors, cause the electron microscope to:*
    *generate the prediction mask, based on the artificial neural network, that indicates one or more areas of the objects of interest; and*
    *generate the scan mask based on the prediction mask.*

23. The system of claim 21, wherein the non-transitory computer readable medium further comprises instructions which, when executed by one or more hardware processors, cause the electron microscope to:

compare a respective prediction value for each individual position in the prediction mask with a threshold value;

responsive to determining that the prediction value for an individual position in the prediction mask is above the threshold value, determine that the individual position is within the first set of regions, in the scan mask, corresponding to the objects of interest identified using the artificial neural network; and responsive to determining that the prediction value for the said individual position in the prediction mask is below the threshold value, determine that the said individual position is within a second set of regions, in the scan mask, not corresponding to the objects of interest identified using the artificial neural network.

24. The system of claim 21 wherein the one or more sets of microscopy parameters comprises one or more of:

a dwell time;
    a resolution;
    an accelerating voltage;
    a beam current;
    a convergence angle; and
    a spot size.

\* \* \* \* \*